United States Patent [19]

Nagashima

[11] Patent Number: 5,227,191
[45] Date of Patent: Jul. 13, 1993

[54] METHOD OF FORMING MULTILAYER INTERCONNECTION STRUCTURE

[75] Inventor: Naoki Nagashima, Kanagawa, Japan

[73] Assignee: Sony Corporation, Tokyo, Japan

[21] Appl. No.: 902,835

[22] Filed: Jun. 23, 1992

[30] Foreign Application Priority Data

Jun. 24, 1991 [JP] Japan .................. 3-151276

[51] Int. Cl.$^5$ .............................................. C23C 16/00
[52] U.S. Cl. ........................................ 427/97; 427/99;
427/255.1; 427/282
[58] Field of Search ............... 427/97, 99, 255.1, 282

[56] References Cited

U.S. PATENT DOCUMENTS

| | | | |
|---|---|---|---|
| 3,691,632 | 9/1972 | Smith | 427/97 |
| 4,650,696 | 3/1987 | Raby | 427/99 |

Primary Examiner—Michael Lusigan
Assistant Examiner—Vi Duong Dang
Attorney, Agent, or Firm—Hill, Steadman & Simpson

[57] ABSTRACT

The disclosure relates to a method of forming a multilayer interconnection structure. The structure is a laminated body having a first conductive layer, a first insulating layer, a second conductive layer and a second insulating layer in an ascending order. In the method, firstly, a through-hole is formed on the laminated body so as to expose a surface of the first conductive layer and two opposed surfaces of the second conductive layer. Then, the two opposed surfaces of the second conductive layer is masked with a masking film, so as not to deposit thereon a metal which has a strong and selective adhesion on the first and second conductive layers. Then, the metal is deposited on the surface of the first conductive layer by a chemical vapor deposition method so as to fill a lower portion of the through-hole with the metal. Then, the masking film is removed so as to expose the two opposed surfaces of the second conductive layer. Then, the metal is deposited on the two opposed surfaces of the second conductive layer by the chemical vapor deposition method so as to fill an upper portion of the through-hole with the metal, such that the through-hole is filled with the metal and that the first and second conductive layers are interconnected with each other. Even if a through-hole has a high aspect ratio, the through-hole is filled with a metal, without having a void space therein.

11 Claims, 4 Drawing Sheets

METHOD OF FORMING MULTILAYER INTERCONNECTION STRUCTURE

BACKGROUND OF THE INVENTION

1. Field of the Invention

The present invention relates in general to a method of forming a multilayer interconnection structure, and more particularly to a method of filling a through-hole with a metal by a chemical vapor deposition (CVD) method so as to obtain a multilayer interconnection.

2. Description of the Prior Art

A multilayer or three dimensional interconnection structure of a semiconductor device has been recently proposed to minimize the interconnection resistance and to save valuable chip area.

Referring to FIG. 7, a conventional method of forming a multilayer interconnection structure 10 will be described. This method comprises the following steps in the sequence.

First, a first insulating layer 12 is deposited on a first conductive layer 14, followed by the deposition of a second conductive layer 16 on the first insulating layer 12. Then, a second insulating layer 18 is deposited on the second conductive layer 16, so as to form a multilayer structure. Then, a through-hole 20 is formed on the multilayer structure so as to expose an upper surface 14a of the first conductive layer 14. The first and second conductive layers 14 and 16 are made of polysilicon, and the first and second insulating layers 12 and 18 are made of $SiO_2$. Then, a metal such as tungsten is deposited in the through-hole 20 using a CVD method. It is noted that tungsten is selectively deposited on polysilicon surface by the CVD method, and not on $SiO_2$ surface. Due to this characteristic of tungsten, it can be selectively deposited on the exposed upper surface 14a of the first conductive layer 14 and on two exposed side surfaces 16a of the second conductive layer 16. If a through-hole has a relatively low aspect ratio, the through-hole is filled with tungsten by growing tungsten deposition. However, due to a recent demand for high integration of semiconductor devices, the through-hole 20 has a relatively high aspect ratio. Due to this, as is seen from FIG. 7, the through-hole 20 tends to be blocked up by the growth of tungsten deposition 22 on the side surfaces 16a of the second conductive layer 16. With this, an undesirable void space 24 is left in the through-hole 20. This space 24 makes the first and second conductive layers 14 and 16 unconnected with each other.

To prevent the formation of the space 24, there is another conventional method of forming a multilayer interconnection structure. This method comprises the following steps in the sequence.

First, a first insulating layer is deposited on a first conductive layer. Then, a through-hole is formed through the first insulating layer so as to expose a portion of an upper surface of the first conductive layer. Then, tungsten is selectively deposited on the portion of the upper surface of the first conductive layer by a CVD method so as to fill the through-hole with tungsten. Then, a second conductive layer is deposited on the first insulating layer so as to interconnect the first and second conductive layers together through the deposited tungsten.

However, the above method is not applicable, for example, to a so-called SOI (Silicon-On-Insulator) multilayer integrated device which requires to deposit the second conductive layer on the first insulating layer before forming the through-hole.

SUMMARY OF THE INVENTION

It is therefore an object of the present invention to provide an improved method of forming a multilayer interconnection structure of which through-hole does not have a void space therein by depositing a metal.

According to the present invention, there is provided a method of forming a multilayer interconnection structure, the method comprising the steps of: (i) depositing a first insulating layer on a first conductive layer, followed by the deposition of a second conductive layer on the first insulating layer; (ii) depositing a second insulating layer on the second conductive layer; (iii) forming a through-hole by opening the second insulating, second conductive and first insulating layers so as to expose a surface of the first conductive layer and two opposed surfaces of the second conductive layer, the through-hole having a first portion in which the surface of the first conductive layer is exposed and a second portion in which the two opposed surfaces of the second conductive layer are exposed; (iv) masking the two opposed surfaces of the second conductive layer with a masking film, so as not to deposit thereon a metal which has a strong and selective adhesion on the first and second conductive layers; (v) depositing the metal on the surface of the first conductive layer by a chemical vapor deposition method so as to fill the first portion of the through-hole with the metal; (vi) removing the masking film so as to expose the two opposed surfaces of the second conductive layer; and (vii) depositing the metal on the two opposed surfaces of the second conductive layer by the chemical vapor deposition method so as to fill the second portion of the through-hole with the metal, such that the through-hole is substantially filled with the metal and that the first and second conductive layers are interconnected with each other.

DESCRIPTION OF THE PREFERRED EMBODIMENTS

Figure 6:
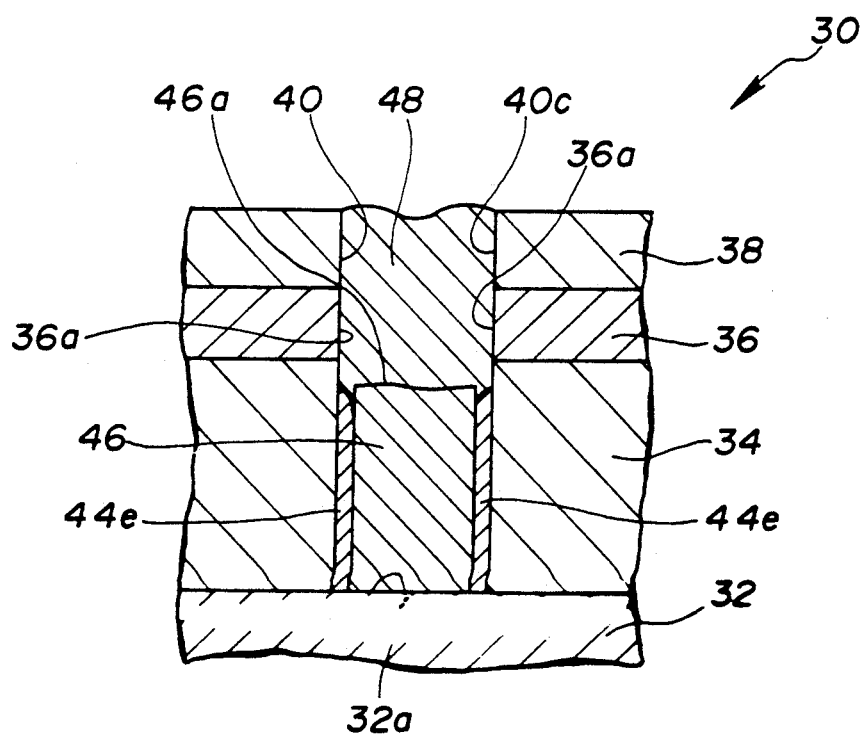
Figure 7:
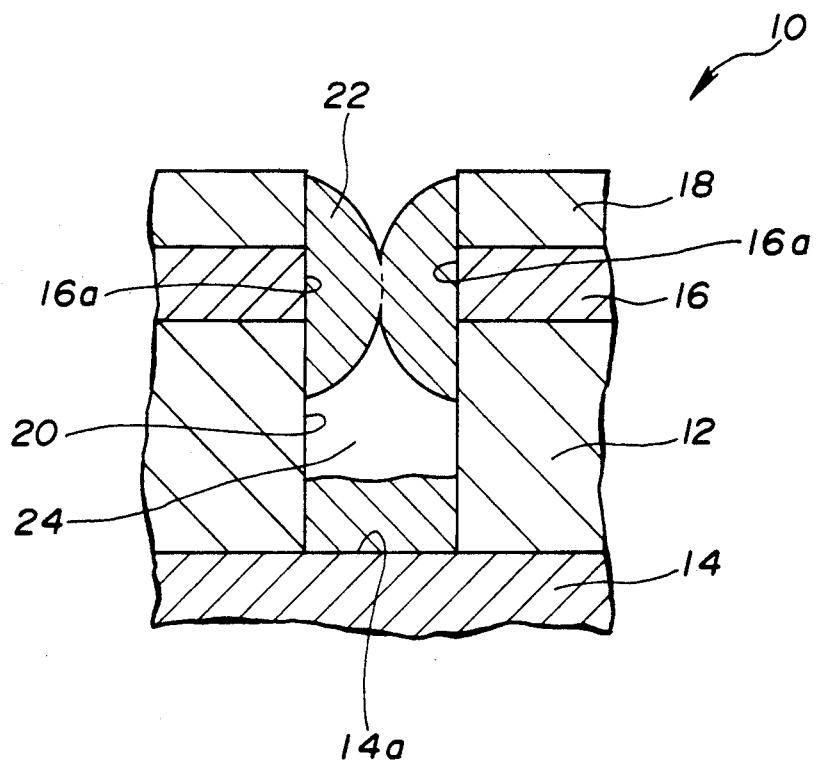
FIG. 7 is a view which is similar to FIGS. 1 to 6, but showing a conventional multilateral interconnection structure and a condition in which a through-hole of the structure is blocked up by the deposition of a metal.

As is seen from FIG. 6, there is provided a multilayer interconnection structure 30 according to the present invention. This structure 30 comprises a first conductive layer 32, a first insulating layer 34, a second conductive layer 36 and a second insulating layer 38. The first and second conductive layers 32 and 36 are made of polysilicon, and the first and second insulating layers 34 and 38 are made of $SiO_2$. The first and second conductive layers 32 and 36 and the first and second insulating layers 34 and 38 are, for example, 300 nm, 150 nm, 600 nm and 250 nm in thickness, respectively.

The multilayer interconnection structure 30 is formed with a through-hole 40 which is filled with a metal such as tungsten. Therefore, the first and second conductive layers 32 and 36 are electrically interconnected with each other through the metal. The through-hole 40 has a width, for example, in a range from 0.5 to 0.9 μm, the width being defined along a horizontal direction parallel to an upper surface 32a of the first conductive layer 32.

Referring to FIGS. 1 to 6, a method of forming the multilayer interconnection structure 30, in accordance with the present invention, will be described. This method comprises the following steps in the sequence.

First, the first conductive layer 32 is deposited on a substrate (not shown), followed by the deposition of the first insulating layer 34 on the first conductive layer 32. Then, the second conductive layer 36 is deposited on the first insulating layer 34, followed by the deposition of the second insulating layer 38 on the second conductive layer 36. With this, a multilayer structure is formed, without having an interconnection between the first and second conductive layers 32 and 36.

Figure 1:
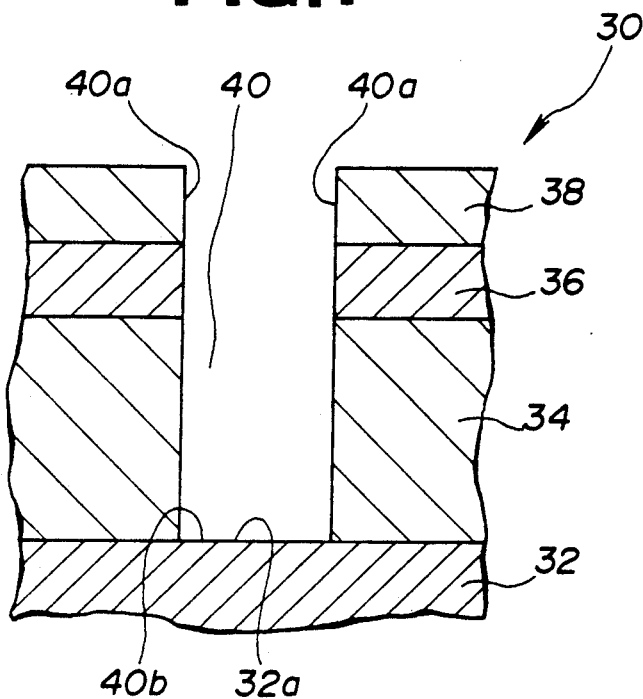
FIGS. 1 to 6 are elevational and sectional views, showing sequential steps of forming a multilayer interconnection structure in accordance with the present invention.

Then, as is seen from FIG. 1, the through-hole 40 is formed on the multilayer structure 30 so as to expose the upper surface 32a of the first conductive layer 32 through photolithography and dry etching techniques. The through-hole 40 defines two opposed side wall portions 40a and a bottom wall portion 40b.

Figure 2:
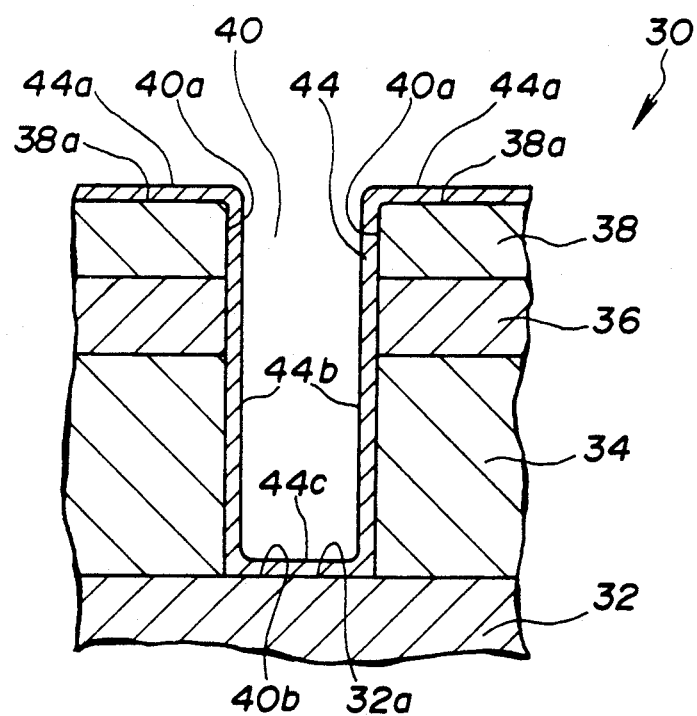

Then, as is seen from FIG. 2, for example, a film 44 made of $SiO_2$ is deposited, by a CVD method, on an upper surface 38a of the second insulating layer 38 and the side wall portions 40a and the bottom wall portion 40b of the through-hole 40. Thus, the deposited film 44 comprises upper wall portions 44a, side wall portions 44b and a bottom wall portion 44c. The film 44 is made to have a thickness of, for example, 30 nm.

Figure 3:
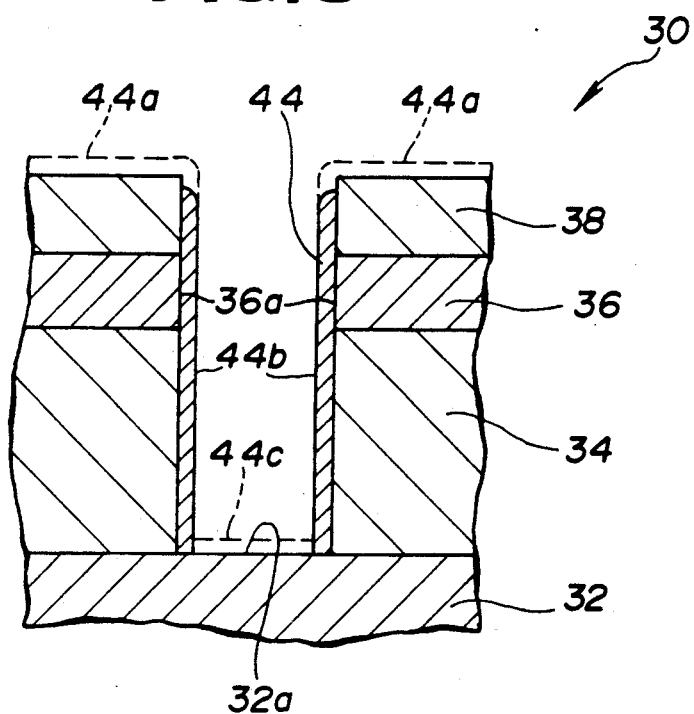

Then, as is seen from FIG. 3, the upper wall portions 44a and the bottom wall portion 44c of the film 44 are removed by reactive ion etching (RIE) as an etch back technique, with leaving only the side wall portions 44b of the film 44. With this, side surfaces 36a of the second conductive layer 36 is still masked so as to prevent deposition of tungsten thereon. RIE is conducted in accordance with, for example, the following conditions:

Source gases and their flow rates: oxygen ($O_2$, 8 SCCM) and methane trifluoride ($CHF_3$, 75 SCCM);
Pressure: 6650 Pa;
Power: 1150 W; and
Etching time: 5 min.

Prior to deposition of tungsten on the upper surface 32a of the first conductive layer 32, a preliminary cleaning treatment such as a wet etching or a dry etching is conducted. As the wet etching, the multilayer structure 30 is treated, for example, with an aqueous mixture of $H_2SO_4$-$H_2O_2$ for 10 min, or with a light etching using a mixture of $H_2O$ and HF in the ratio of 100 to 1 for 30 sec. As the dry etching, for example, a $N_2$ plasma etching or a $H_2$ plasma etching is conducted. The $N_2$ plasma etching is conducted in accordance with, for example, the following conditions:

Source gases and their flow rates: $N_2$ (50 SCCM), $NF_3$ (5 SCCM) and Ar (5 SCCM);
Power: 88 W (0.5 W/$cm^2$); and
Temperature: up to 100° C.

The $H_2$ plasma etching is conducted in accordance with, for example, the following conditions:

Source gases and their flow rates: $H_2$ (50 SCCM), $NF_3$ (10 SCCM) and Ar (5 SCCM);
Power: 88 W (0.5 W/$cm^2$); and
Temperature: up to 100° C.

Figure 4:
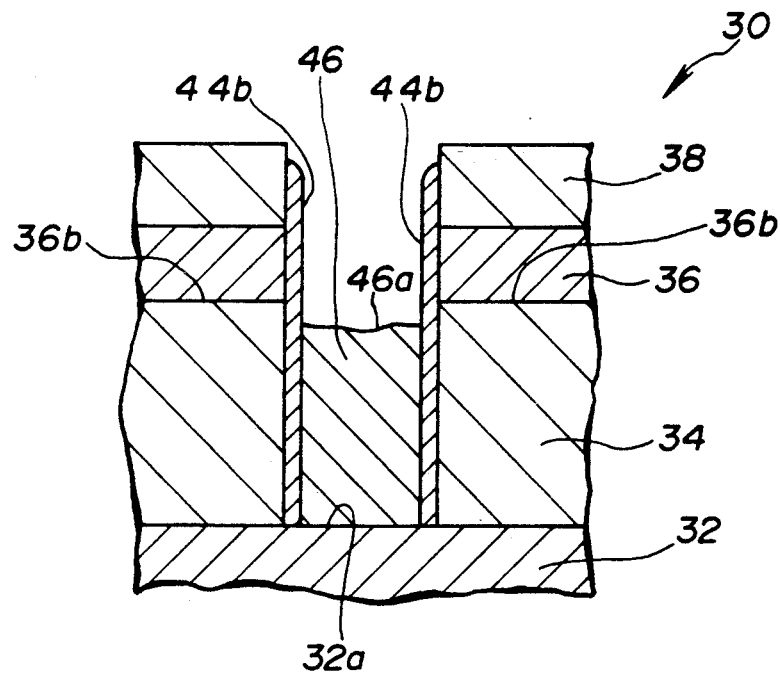

As is seen from FIG. 4, after the preliminary cleaning treatment, tungsten 46 is selectively deposited by a CVD method on the upper surface 32a of the first conductive layer 32 in a vertical direction perpendicular to the upper surface 32a of the first conductive layer 32, until the top surface 46a of the deposited tungsten 46 reaches a height just below that of a lower surface 36b of the second conductive layer 36. It should be noted that tungsten has poor adhesion on $SiO_2$ surface and strong adhesion on polysilicon surface. Thus, tungsten is selectively deposited on the first polysilicon conductive layer 32 in the vertical direction. This deposition manner does not lead to the formation of a void space in the deposited tungsten 46.

As the above-mentioned CDV method to selectively deposit tungsten, for example, a so-called silane reduction method using silane as a reducing agent, or a so-called hydrogen reduction method using hydrogen as a reducing agent is used.

The silane reduction method is conducted in accordance with, for example, the following conditions:

Source gases and their flow rates: silane ($SiH_4$, 7 SCCM), argon (Ar, 15 SCCM), tungsten hexafluoride ($WF_6$, 10 SCCM) and hydrogen ($H_2$, 1000 SCCM); and
Temperature: 260° C. (240°-280° C.).

The hydrogen reduction method has two stages having two different tungsten hexafluoride flow rates. The first stage is conducted in accordance with, for example, the following conditions:

Source gases and their flow rates: hydrogen ($H_2$, 500 SCCM), argon (Ar, 10 SCCM), and tungsten hexafluoride ($WF_6$, 0.5 SCCM); and
Temperature: 450°-470° C.

The second stage is conducted in accordance with, for example, the following conditions:

Source gases and their flow rates: hydrogen ($H_2$, 500 SCCM), argon (Ar, 10 SCCM), and tungsten hexafluoride ($WF_6$, 5 SCCM); and
Temperature: 450°-470° C.

Figure 5:
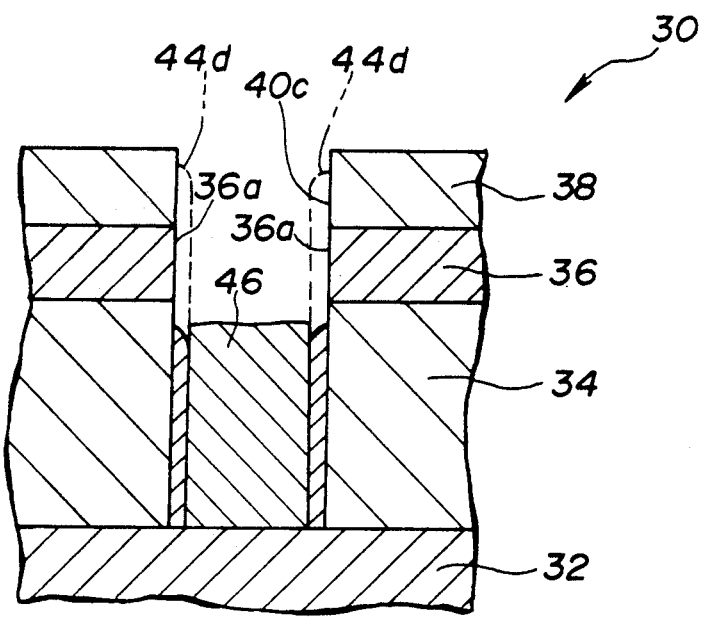

Then, as is seen from FIG. 5, an upper portions 44d of the side wall portions 44b of the film 44 are removed by, for example, the aforementioned light etching (etching time: 30 sec) and the aforementioned $N_2$ plasma etching so as to expose the side surfaces 36a of the second conductive layer 36.

Then, as is seen from FIG. 6, tungsten 48 is selectively deposited by the aforementioned CVD method on the side surfaces 36a of the second conductive layer 36. This selective deposition is continued until an upper unfilled space 40c of the through-hole 40 is filled with tungsten 48. It should be noted that the upper unfilled space 40c of the through-hole 40 has an aspect ratio which is much lower than that of the entire through-hole 40, and that the top surface 46a of the aforementioned tungsten deposition 46 is positioned very close to the side surfaces 36a of the second conductive layer 36. Therefore, there is not produced at all a void space in the upper portion 40c of the through-hole 40. Thus, the through-hole 40 is substantially totally filled with tungsten, with having therein lower remaining portions 44e of the side wall portions 44b of the film 44. Therefore, the first and second conductive layers 32 and 36 are securely interconnected with each other.

It is optional to use another metal besides tungsten as long as it is selectively deposited on the exposed surfaces of the first and second conductive layers 32 and 36, and not on the exposed surfaces of the first and second insulating layers 34 and 38.

In stead of the deposition of the $SiO_2$ film 44 on the side surfaces 36a of the second conductive layer 36 to mask the same, it is optional to oxidize or nitride the side surfaces 36a so as to prevent deposition of the metal thereon, and then to remove the oxidized or nitrided surfaces by an anisotropic etching followed by the metal deposition thereon.

It is optional to use other materials for the first and second conductive layers 32 and 36 and for the first and second insulating layers 34 and 38 besides polysilicon and $SiO_2$.

What is claimed is:

1. A method of forming a multilayer interconnection structure, comprising the steps of:
    providing a first conductive layer;
    forming a first insulating layer on said first conductive layer;
    forming a second conductive layer on said first insulating layer;
    forming a second insulating layer on said second conductive layer;
    forming a through hole in said second insulating, said second conductive and said first insulating layers so as to expose a portion of said first conductive layer and a portion of said second conductive layer, said through hole having sidewalls extending through said second insulating, second conductive and first insulating layers;
    masking at least the exposed portion of the second conductive layer with a masking film effective to prevent deposit thereon of a metal which has a strong and selective adhesion on said first and second conductive layers;
    partially filling the through hole with a metal which contacts the exposed portion of said first conductive layer;
    re-exposing said portion of said second conductive layer masked by said masking film by removing said masking film from said portion of said second conductive layer; and
    substantially filling a remainder of said through hole with said metal so that said first and second conductive layers are electrically interconnected with each other.

2. A method according to claim 1, wherein said first and second conductive layers are made of polysilicon.

3. A method according to claim 1, wherein said first and second insulating layers are made of $SiO_2$.

4. A method according to claim 1, wherein said masking film is made of $SiO_2$.

5. A method according to claim 1, wherein said metal is tungsten.

6. A method according to claim 1, wherein said through-hole is formed by photolithography and dry etching techniques.

7. A method according to claim 1, wherein said masking film is initially deposited on an upper exposed surface of said second insulating layer, the sidewalls of said through-hole and the exposed portions of said first conductive layer.

8. A method according to claim 7, wherein in the step of re-exposing said masked portion of said conductive layer, said masking film deposited on the upper exposed surface of said second insulating layer and the exposed portion of said first conductive layer is removed by an ion reactive etching step.

9. A method according to claim 8, wherein two portions of said masking film deposited on the opposed wall portions of said through-hole are removed by an isotropic etching so as to expose the two opposed surfaces of said second conductive layer.

10. A method according to claim 1, wherein the deposition of said metal on the surface of said first conductive layer is continued until an end surface of the deposited metal reaches a position close to the opposed surfaces of said second conductive layer.

11. A method of forming a multilayer interconnection structure, comprising the steps of:
    providing a first conductive layer made of polysilicon;
    forming a first insulating layer made of $SiO_2$ on said first conductive layer;
    forming a second conductive layer made of polysilicon on said first insulating layer;
    forming a second insulating layer made of $SiO_2$ on said second conductive layer;
    forming a through hole in said second insulating, said second conductive and said first insulating layers so as to expose a portion of said first conductive layer and a portion of said second conductive layer, said through hole having sidewalls extending through said second insulating, second conductive and first insulating layers;
    masking at least the exposed portion of the second conductive layer with a masking film effective to prevent deposit thereon of a metal which has a strong and selective adhesion on said first and second conductive layers by oxidizing or nitriding said exposed portion of said second conductive layer;
    partially filling the through hole with a metal which contacts the exposed portion of said first conductive layer by depositing said metal by chemical vapor disposition;
    re-exposing said portion of said second conductive layer masked by said masking film by removing said making film from said portion of said second conductive layer; and
    substantially filling a remainder of said through hole with said metal by chemical vapor deposition so that said first and second conductive layers are electrically interconnected with each other.

* * * * *